US 11,309,848 B2

(12) United States Patent
Britz et al.

(10) Patent No.: US 11,309,848 B2
(45) Date of Patent: Apr. 19, 2022

(54) CLASS D TRANSCONDUCTANCE AMPLIFIER

(71) Applicant: Fluke Corporation, Everett, WA (US)

(72) Inventors: William J. Britz, Tulalip, WA (US); Jake R. Richards, Everett, WA (US)

(73) Assignee: Fluke Corporation, Everett, WA (US)

( * ) Notice: Subject to any disclaimer, the term of this patent is extended or adjusted under 35 U.S.C. 154(b) by 0 days.

(21) Appl. No.: 16/986,195

(22) Filed: Aug. 5, 2020

(65) Prior Publication Data

US 2020/0366252 A1 Nov. 19, 2020

Related U.S. Application Data

(62) Division of application No. 16/277,644, filed on Feb. 15, 2019, now Pat. No. 10,771,020.

(51) Int. Cl.
*H03F 3/217* (2006.01)
*H03F 1/32* (2006.01)
*H03F 3/45* (2006.01)

(52) U.S. Cl.
CPC ....... *H03F 1/3211* (2013.01); *H03F 3/45475* (2013.01); *H03F 2200/129* (2013.01); *H03F 2200/171* (2013.01); *H03F 2200/261* (2013.01); *H03F 2203/45701* (2013.01)

(58) Field of Classification Search
CPC ..................................................... H03F 3/217
USPC ............................................ 330/251, 207 A
See application file for complete search history.

(56) References Cited

U.S. PATENT DOCUMENTS

| 5,627,460 | A | * | 5/1997 | Bazinet | .................. | G05F 1/618 |
| | | | | | | 323/288 |
| 6,362,702 | B1 | | 3/2002 | Nielsen et al. | | |
| 7,107,468 | B2 | | 9/2006 | Pullen et al. | | |
| 7,151,404 | B2 | * | 12/2006 | Lee | ......................... | H03F 3/185 |
| | | | | | | 330/10 |

(Continued)

FOREIGN PATENT DOCUMENTS

EP    3 068 048 A1    9/2016

OTHER PUBLICATIONS

Extended European Search Report, dated Jun. 29, 2020, for European Application No. 20157503.2-1203, 11 pages.

(Continued)

*Primary Examiner* — Henry Choe
(74) *Attorney, Agent, or Firm* — Seed Intellectual Property Law Group LLP

(57) ABSTRACT

An amplifier circuit includes: a Schmidt trigger having an input electrically coupled to an input of the amplifier circuit, a switching network electrically coupled to an output of the Schmidt trigger, an inductor electrically coupled to the switching network, a first resistor electrically coupled to the inductor, a capacitor electrically coupled to the first resistor, a first feedback circuit that provides a first feedback signal to the input of the Schmidt trigger based on a voltage at a first node electrically coupled to the first resistor and to the capacitor, a second resistor electrically coupled to the output of the amplifier circuit, a third resistor electrically coupled to the second resistor, and a second feedback circuit that provides a second feedback signal to the input of the Schmidt trigger based on a voltage at a second node electrically coupled to the second resistor and to the third resistor.

10 Claims, 5 Drawing Sheets

(56) References Cited

U.S. PATENT DOCUMENTS

| | | | |
|---|---|---|---|
| 7,511,403 B2 * | 3/2009 | Smith | H02N 2/067 |
| | | | 310/316.02 |
| 7,719,361 B2 | 5/2010 | Pera | |
| 8,207,711 B2 * | 6/2012 | Crawford | H05B 45/375 |
| | | | 323/207 |
| 8,593,123 B2 | 11/2013 | Chen et al. | |
| 9,733,283 B2 | 8/2017 | Harriman | |
| 10,175,278 B1 | 1/2019 | Paduvalli | |
| 2002/0125869 A1 | 9/2002 | Groom et al. | |
| 2008/0068076 A1 | 3/2008 | Manstretta | |
| 2009/0232332 A1 | 9/2009 | Horbach et al. | |
| 2010/0207543 A1 | 8/2010 | Crawford et al. | |

OTHER PUBLICATIONS

Torres et al., "A Low-Power High-PSRR Clock-Free Current-Controlled Class-D Audio Amplifier," *IEEE Journal of Solid-State Circuits* 46(7): 1553-1561, 2011.

* cited by examiner

CLASS D TRANSCONDUCTANCE AMPLIFIER

BACKGROUND

Technical Field

The present disclosure relates to amplifier circuits and, more particularly, to amplifier circuits that output currents having magnitudes that are proportional to input voltage magnitudes.

Description of the Related Art

Electronic test equipment, such as digital multimeter devices made by Fluke Corporation, for example, are commonly used to measure characteristics of electric circuits. For example, digital multimeter devices are commonly used to measure alternating current (AC) and direct current (DC) in electric circuits, wherein the measured current can range from picoamps to kiloamps. Because digital multimeter devices and other electronic equipment need to be calibrated, calibration devices are available which include calibration circuits that precisely source known electrical parameters, including alternating and direct currents, usually up to 10's of Amperes. In other words, the calibration circuits may output currents having predetermined magnitudes, which correspond to input voltages having predetermined magnitudes, wherein the currents are supplied to measurement circuits and corresponding measurements by the measurement circuits are calibrated or adjusted so that values of the measured magnitudes of the currents respectively correspond to the predetermined magnitudes of the calibrating currents. Conventionally, the circuits used to precisely source alternating and direct currents have been linear transconductance power amplifiers. A transconductance amplifier is an amplifier having an output signal that is proportional to an input signal that is a voltage signal.

Class D amplifiers are a type of switching power converters called buck converters. In a buck converter, the output signal is a voltage and the input is a raw DC voltage greater than a maximum output voltage. Because a buck converter uses pulse width modulation (PWM) and low-loss energy storage elements, capacitors, and inductors, the efficiency in power conversion can be quite high. A Class D amplifier is a buck converter in which a control voltage can vary rapidly, and the output voltage is proportional to the control voltage. A modern implementation of a Class D amplifier is a Universal Class D (UCD) amplifier. The UCD amplifier is self-oscillating and uses voltage feedback to improve linearity and to force oscillation. Class D amplifiers have never been used for current sources due the fact that their output is a voltage and the desired output is a current.

BRIEF SUMMARY

The present application discloses an amplifier circuit that is an adaptation of a Class D amplifier which operates as a transconductance amplifier. The amplifier circuit according to the present disclosure uses current feedback to force oscillation and to improve linearity of the current output. The current feedback also guarantees that the output of the amplifier circuit is a current that is proportional to the input voltage. The output current of the amplifier circuit is constant with load impedance, which is a requirement for a transconductance amplifier.

A circuit according to a first embodiment of the present disclosure may be summarized as including: an input terminal; an output terminal; a comparator including a first input terminal, a second input terminal, and an output terminal, wherein the first input terminal of the comparator is electrically coupled to the input terminal of the circuit, and the second input terminal of the comparator is electrically coupled to the output terminal of the comparator; a first transistor electrically coupled to the output terminal of the comparator; a second transistor electrically coupled to the output terminal of the comparator; an inductor electrically coupled to the first transistor and the second transistor; a first resistor electrically coupled between the inductor and the output terminal of the circuit; and a differential amplifier including a first input terminal electrically coupled to a first terminal of the first resistor, a second input terminal electrically coupled to a second terminal to the first resistor, and an output terminal coupled to the first input terminal of the comparator to provide a feedback signal to the comparator.

The circuit may further include: a second resistor including a first terminal electrically coupled to the output terminal of the comparator, and a second terminal electrically coupled to the second input terminal of the comparator; and a third resistor including a first terminal electrically coupled to the second input terminal of the comparator and the second terminal of the second resistor, and a second terminal electrically coupled to a ground terminal. Also, the circuit may further include: an inverter including an input terminal electrically coupled to the output terminal of the comparator and the first terminal of the second resistor, and an output terminal electrically coupled to the second transistor.

Each of the first transistor and the second transistor may be an n-channel Metal Oxide Field-Effect Transistor (MOSFET), the output terminal of the comparator may be electrically coupled to a gate terminal of the first transistor and the input terminal of the inverter, the output terminal of the inverter may be electrically coupled to a gate terminal of the second transistor, and a source terminal of the first transistor may be electrically coupled to a drain terminal of the second transistor and to the inductor.

The comparator may be included in a Schmidt trigger.

The circuit may further include: a fourth resistor coupled between the first input terminal of the comparator and the output terminal of the differential amplifier; and a fifth resistor coupled between the input terminal of the circuit and the first input terminal of the comparator.

The circuit may further include a capacitor that filters the output voltage from the first resistor, the capacitor including a first terminal electrically coupled to the second terminal of the first resistor, and a second terminal electrically coupled to a ground terminal. Also, the circuit may further include a third resistor that provides a load impedance, the third resistor including a first terminal electrically coupled to the second terminal of the first resistor and the first terminal of the capacitor, and a second terminal electrically coupled to the ground terminal.

The first input terminal of the comparator may be an inverting input terminal; and the second input terminal of the comparator may be a non-inverting input terminal.

The first input terminal of the differential amplifier may be a non-inverting input terminal; and the second input terminal of the differential amplifier may be an inverting input terminal.

An amplifier circuit according to a second embodiment of the present disclosure may be summarized as including: a Schmidt trigger having an input electrically coupled to an input of the amplifier circuit; a switching network electrically coupled to an output of the Schmidt trigger; an inductor electrically coupled to the switching network, wherein based on a state of the switching network, the switching network provides a positive supply voltage or a negative supply voltage to the inductor, and wherein the inductor provides a circuit path for current to flow to an output of the amplifier circuit; a first resistor electrically coupled to the inductor; a capacitor electrically coupled to the first resistor; a first feedback circuit that provides a first feedback signal to the input of the Schmidt trigger based on a voltage at a first node electrically coupled to the first resistor and to the capacitor; a second resistor electrically coupled to the output of the amplifier circuit; a third resistor electrically coupled to the second resistor; and a second feedback circuit that provides a second feedback signal to the input of the Schmidt trigger based on a voltage at a second node electrically coupled to the second resistor and to the third resistor, wherein the current at the output of the amplifier circuit is proportional to an input voltage applied to the input of the amplifier circuit.

The first feedback circuit may include a first operational amplifier electrically coupled in series with a fourth resistor, and the second feedback circuit may include a second operational amplifier electrically coupled in series with a fifth resistor.

The switching network may include: a first transistor having a gate that is electrically coupled to the output of the Schmidt trigger, and a source that is electrically coupled to the positive supply voltage; and a second transistor having a gate that is electrically coupled to the output of the Schmidt trigger via an inverter, and a drain that is electrically coupled to a negative supply voltage.

The inductor may be electrically coupled to a drain of the first transistor and to a source of the second transistor, such that the inductor receives either the positive supply voltage via the first transistor or the negative supply voltage via the second transistor depending on the alternating signals provided by the Schmidt trigger.

A first terminal of the first resistor is electrically coupled to the inductor, to the first switch, and to the second switch; a second terminal of the first resistor is electrically coupled to a first terminal of the capacitor and to the first node; and a second terminal of the capacitor is electrically coupled to ground.

The Schmidt trigger may provide hysteresis to the amplifier circuit.

The amplifier circuit may further include filter circuitry coupled to the inductor that smooths fluctuations in the magnitude of the current flowing through the inductor to the output of the amplifier circuit.

A method according to a third embodiment of the present disclosure may be summarized as including: electrically coupling an input voltage to an input terminal of a Schmidt trigger; generating a control signal at an output terminal of the Schmidt trigger based on a voltage at the input terminal of the Schmidt trigger and hysteresis of the Schmidt trigger; electrically coupling a first terminal of an inductor to a first switch and a second switch; controlling the first switch and the second switch based on the control signal from the Schmidt trigger; electrically coupling a second terminal of the inductor to a first terminal of a first resistor; generating a feedback signal based on a difference between a first voltage at the first terminal of the first resistor and a second voltage at a second terminal of the first resistor; electrically coupling the feedback signal to the first input terminal of the Schmidt trigger; and outputting a current having a magnitude that is proportional to a magnitude of the input voltage.

The method may further include smoothing fluctuations in the magnitude of a current flowing through the inductor.

The first resistor may operate to sense a current flowing through the inductor, and wherein generating the feedback signal may include electrically coupling the first terminal of the first resistor as first input to an instrumentation amplifier and electrically coupling the second terminal of the first resistor as second input to the instrumentation amplifier, the instrumentation amplifier operating as a differential amplifier that produces the feedback signal based on the difference in the voltage applied as the first and second inputs to the instrumentation amplifier.

DETAILED DESCRIPTION

Figure 1:
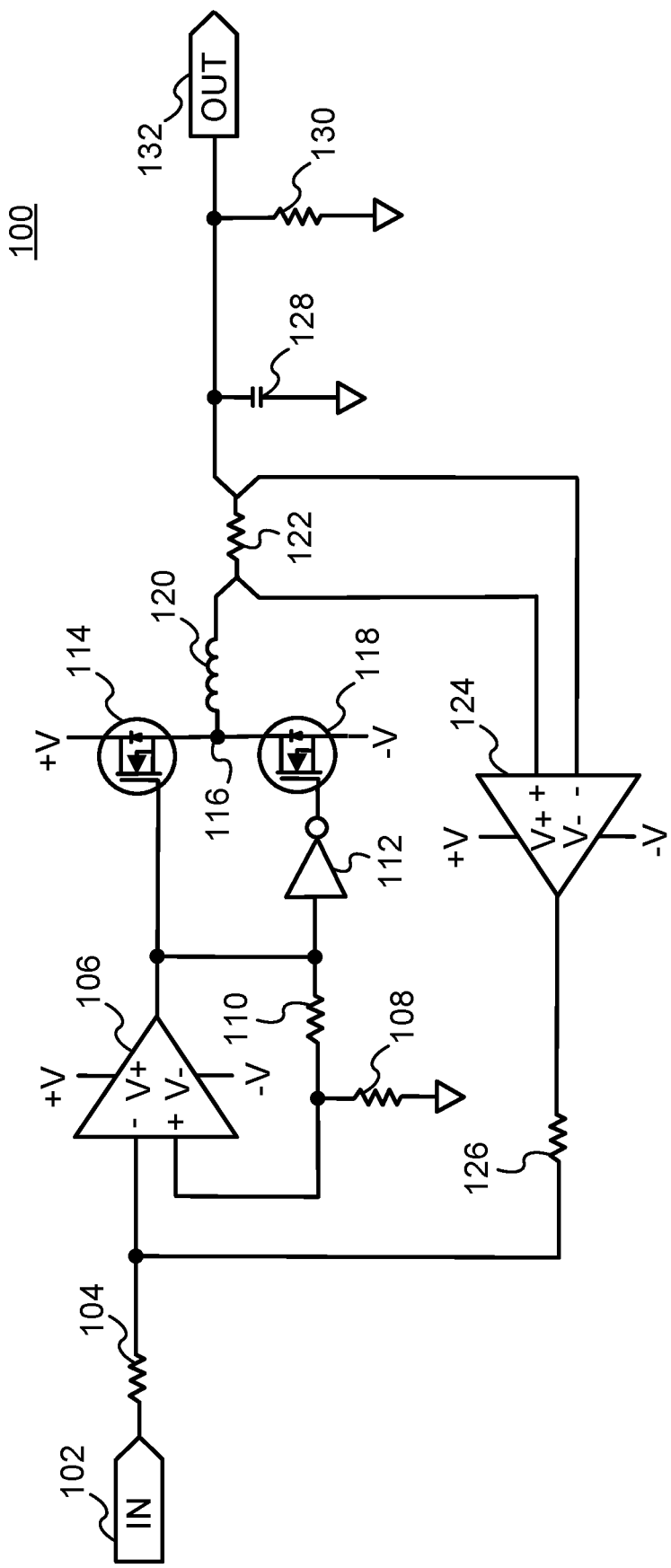
FIG. 1 is a diagram of an amplifier circuit, according to one or more embodiments of the present disclosure.

Described herein is a self-oscillating transconductance amplifier with class D switching operation that provides a constant output current proportional to input voltage, without regard to load impedance. FIG. 1 is a diagram of an amplifier circuit 100, according to one or more embodiments of the present disclosure. The timing diagram provided in FIG. 2, described later herein, is helpful to observe the operational features of the circuit 100.

The amplifier circuit 100 includes an input terminal 102 that is electrically coupled to a first terminal of a resistor 104. To control the output of the amplifier circuit 100, a voltage is input to the amplifier circuit 100 via the input terminal 102, wherein the magnitude of a current output from the amplifier circuit 100 is proportional to a magnitude of the input voltage, as will be described below. A second terminal of the resistor 104 is electrically coupled to an inverting input terminal of an operational amplifier configured as a comparator 106. A positive supply voltage +V is electrically coupled to a power supply terminal V+ of the comparator 106. A negative supply voltage −V is electrically coupled to a power supply terminal V− of the comparator 106. The comparator 106 includes the inverting input terminal, a non-inverting input terminal, and an output terminal. If the voltage at the non-inverting input terminal of the comparator 106 is greater than the voltage at the inverting input terminal of the comparator 106, the voltage at the output terminal of the comparator 106 is the positive supply voltage +V. Additionally, if the voltage at the non-inverting input terminal of the comparator 106 is less than the voltage at the inverting input terminal of the comparator 106, the voltage at the output terminal of the comparator 106 is the negative supply voltage −V.

Figure 3:
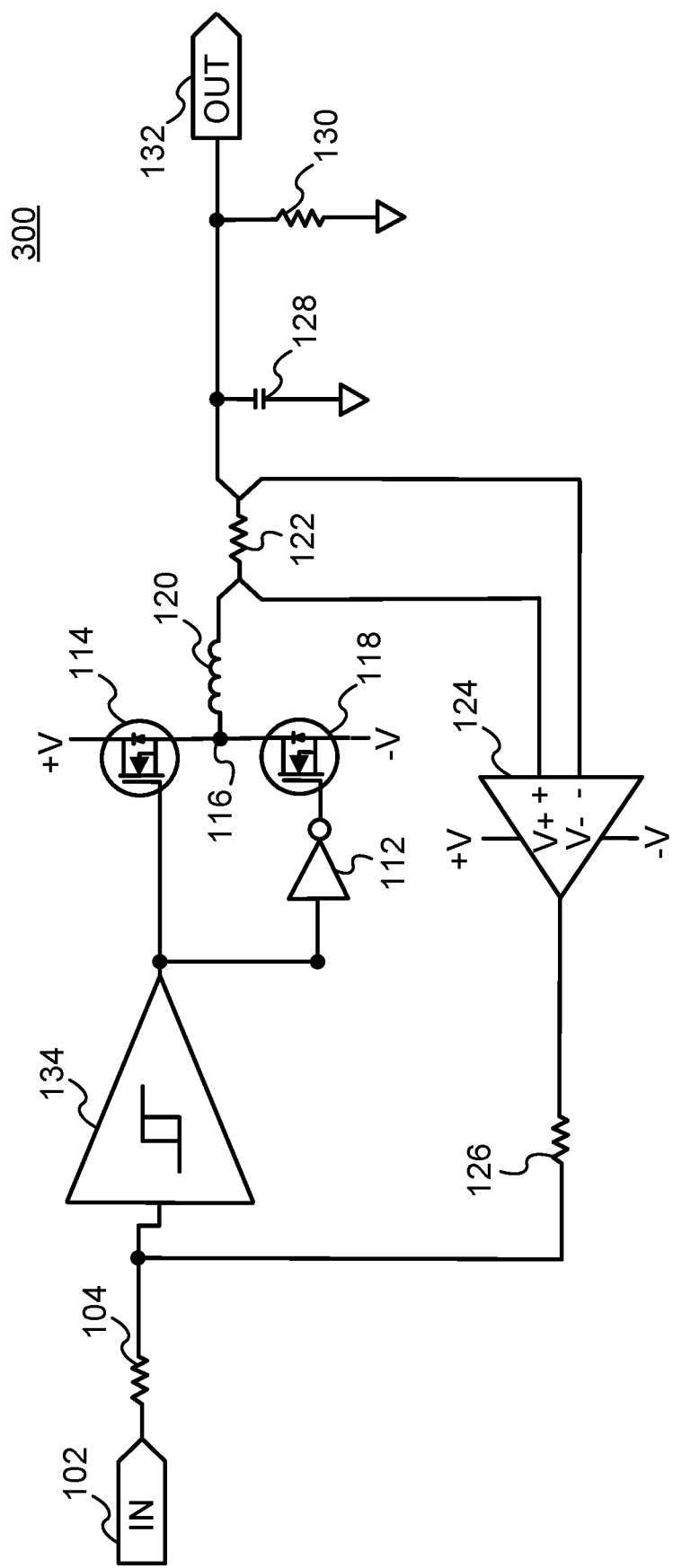
FIG. 3 is a diagram of another amplifier circuit, according to one or more embodiments of the present disclosure.

A first terminal of a resistor 108 is electrically coupled to the non-inverting input terminal of the comparator 106 and a first terminal of a resistor 110. A voltage at the first terminal of the resistor 108 that is coupled to the non-inverting input terminal of the comparator 106 is used as a hysteresis threshold voltage that controls oscillation of the output of comparator 106, as described below. A second terminal of the resistor 108 is electrically coupled to a ground terminal. A second terminal of the resistor 110 is electrically coupled to the output terminal of the comparator 106 and an input terminal of an inverter 112. If the voltage at the input terminal of the inverter 112 is a high value, the voltage at an output terminal of the inverter 112 is a low value; and, if the voltage at the input terminal of the inverter 112 is a low value, the voltage at the output terminal of the inverter 112 is a high value. The comparator 106 shown in FIG. 1 is configured to operate as a Schmidt trigger. In one or more embodiments, the comparator 106 is included in a Schmidt trigger. The comparator 106 and the resistors 108 and 110 could be replaced by a discrete Schmidt trigger component, for example, as shown in FIG. 3 and described below.

The output terminal of the comparator 106 also is electrically coupled to a gate terminal of a transistor 114. In one or more embodiments, the transistor 114 is an n-channel Metal Oxide Field-Effect Transistor (MOSFET). A drain terminal of the transistor 114 is electrically coupled to the positive supply voltage +V. A source terminal of the transistor 114 is electrically coupled to a node 116, which is electrically coupled to a drain terminal of a transistor 118 and a first terminal of an inductor 120. In one or more embodiments, the transistor 118 is an n-channel Metal Oxide Field-Effect Transistor (MOSFET). A source terminal of the transistor 118 is electrically coupled to the supply voltage −V. A gate terminal of the transistor 118 is electrically coupled to the output terminal of the inverter 112.

The transistor 114 and the transistor 118 are switches that form a switching network that is controlled based on a control signal that is output from the output terminal of the comparator 106 and provided to the gate terminals of the transistor 114 and the transistor 118. Because the inverter 112 causes the voltage levels at the respective gate terminals of the transistor 114 and the transistor 118 to be opposite one another, when the transistor 114 is turned on by the voltage of the control signal at the output of the comparator 106, the transistor 118 is turned off. Additionally, when the transistor 114 is turned off by the voltage of the control signal at the output of the comparator 106, the transistor 118 is turned on.

A second terminal of the inductor 120 is electrically coupled to a first terminal of a resistor 122 and a non-inverting input terminal of an instrumentation amplifier 124. The instrumentation amplifier 124 may include a plurality of operational amplifiers (e.g., 3 operational amplifiers) configured as a differential amplifier that includes input buffer amplifiers. The positive supply voltage +V is electrically coupled to a power supply terminal V+ of the instrumentation amplifier 124. The negative supply voltage −V is electrically coupled to a power supply terminal V− of the instrumentation amplifier 124. An output terminal of the instrumentation amplifier 124 outputs a feedback signal and is electrically coupled to a first terminal of a resistor 126. A second terminal of the resistor 126 is electrically coupled to the inverting input terminal of the comparator 106. The respective magnitudes of the resistances of the resistor 126 and the resistor 104 are selected to obtain a desired gain of the amplifier circuit 100. The voltage of the feedback signal at the output terminal of the instrumentation amplifier 124 is equal to a gain of the instrumentation amplifier 124 multiplied by the difference between the voltage at a non-inverting input terminal of the instrumentation amplifier 124 and the voltage at the inverting input terminal of the instrumentation amplifier 124.

A second terminal of the resistor 122 is electrically coupled to the inverting input terminal of the instrumentation amplifier 124, a first terminal of a capacitor 128, a first terminal of a resistor 130, and an output terminal 132 of the amplifier circuit 100. A second terminal of the capacitor 128 is electrically coupled to a ground terminal. The capacitor 128 acts as a filter that removes high-frequency components of the current flowing through the inductor 120 that is output from the output terminal 132 of the amplifier circuit 100. A second terminal of the resistor 130 is electrically coupled to a ground terminal. The resistor 130 acts as a load of the amplifier circuit 100. Although not illustrated in FIG. 1, all of the ground terminals depicted by small triangles in FIG. 1 are electrically coupled together and, thus, are at a common voltage or potential.

Figure 2:
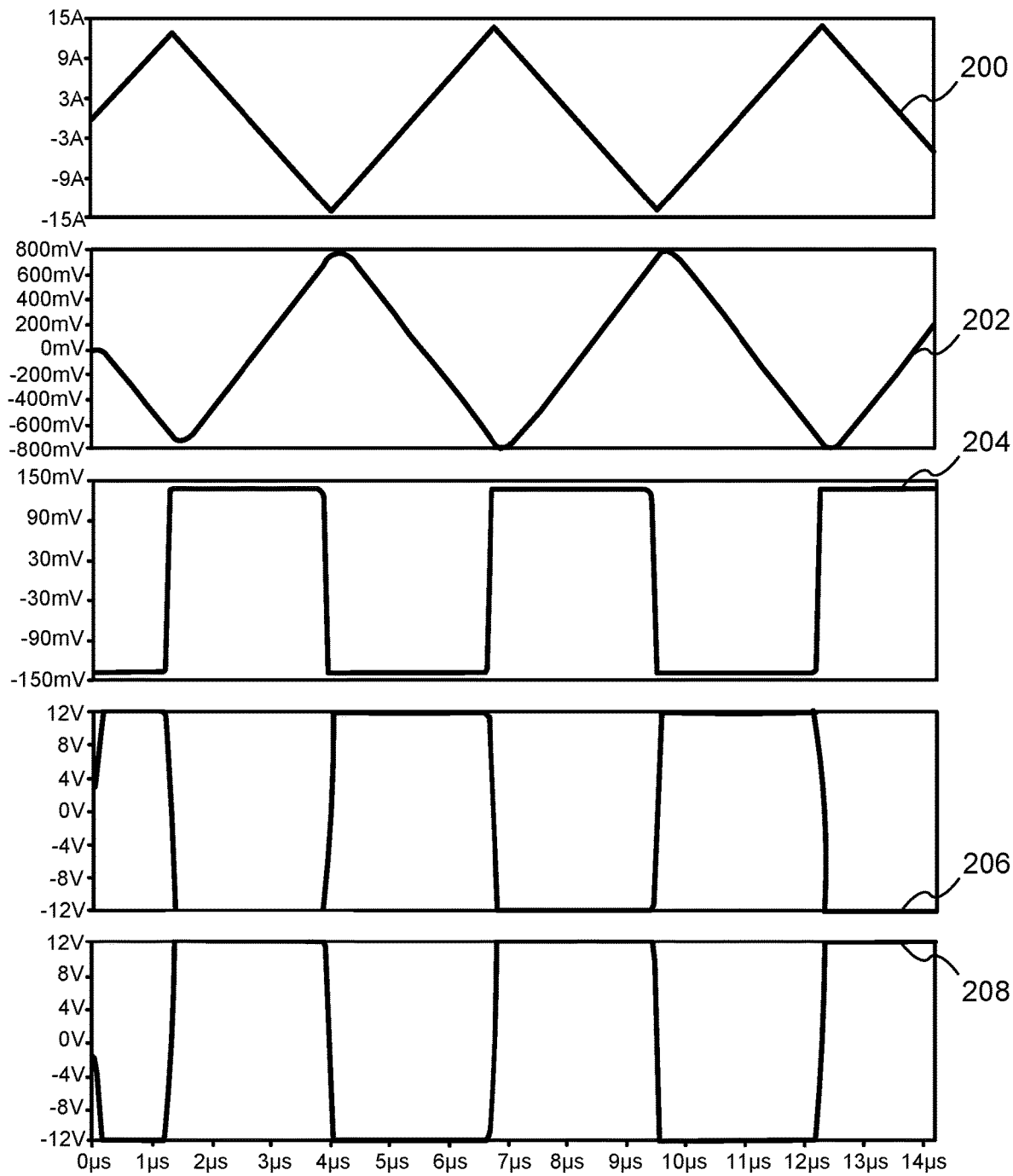
FIG. 2 is a timing diagram for the amplifier circuit shown in FIG. 1, according to one or more embodiments of the present disclosure.

Having described the structure of the amplifier circuit 100, operation of the amplifier circuit 100 will now be described with reference to FIG. 2. As noted earlier, FIG. 2 is a timing diagram for the amplifier circuit 100, according to one or more embodiments of the present disclosure. FIG. 2 shows a waveform 200 corresponding to the current flowing through the inductor 120 that is output from the output terminal 132 of the amplifier circuit 100, a waveform 202 corresponding to the voltage of the feedback signal at the output terminal of the instrumentation amplifier 124, a waveform 204 corresponding to the hysteresis threshold voltage at the non-inverting input terminal of the comparator 106, a waveform 206 corresponding to the voltage at the gate terminal of the transistor 114, and a waveform 208 corresponding to the voltage at the gate terminal of the transistor 118.

Initially, a voltage at the input terminal 102 of the amplifier circuit 100 is 0V, a voltage at the output terminal 132 of the amplifier circuit 100 is 0V, the current flowing through the inductor 120 that is output from the output terminal 132 of the amplifier circuit 100 is 0 A, and a voltage at the node 116 is +V as the transistor 114 is on and the transistor 118 is off. The current in the inductor 120 initially is 0 A and starts to ramp up, wherein the current flowing in the inductor 120 is given by Equation 1.

$$IL = V*T/L \qquad \text{(Equation 1)}$$

In Equation 1, IL is the current flowing in the inductor 120, T is time, and L is the inductance of the inductor 120.

The current in the inductor 120 continues to ramp in the positive direction until the output of the instrumentation amplifier 124 drives the comparator 106 input above a positive hysteresis threshold voltage. At this point the output of the comparator 106 switches from Hi to Lo, which causes the transistor 114 to turn off and the transistor 118 to turn on. The current in the inductor 120 then begins to ramp in the negative direction and continues until the input voltage of the comparator 106 falls below a negative hysteresis threshold voltage.

The resistor 122 acts as a shunt between the inductor 120 and the output terminal 132 of the amplifier circuit 100. The voltage across the shunt resistor 122 is small so that the voltage drop does not appreciably affect the current output of the circuit 100, yet is able to provide an indication of sensed current to the instrumentation amplifier 124. The instrumentation amplifier 124 uses the shunt resistor 122 to directly sense the current in the inductor 120, which avoids creating undesirable common mode voltage at the switching frequency of the transistors 114, 118. With the feedback provided by the instrumentation amplifier 124 based on the sensed inductor current, the amplifier circuit 100 is self-oscillating and operates as a true transconductance class D amplifier. While the illustrated circuit uses a shunt resistance to sense the inductor current, it should be noted that other technology for sensing the inductor current may be used, such as an inductive (magnetic) pickup sensor, a Hall effect sensor, or a current transformer transducer circuit.

FIG. 3 is a diagram of another amplifier circuit 300, according to one or more embodiments of the present disclosure. The amplifier circuit 300 shown in FIG. 3 is similar in many relevant respects to the amplifier circuit 100 shown in FIG. 1. The same reference numbers are used in FIGS. 1 and 3 to identify similar components. Notably, the amplifier circuit 300 does not include the comparator 106 and the resistors 108 and 110, which are included in the amplifier circuit 100. Instead, the amplifier circuit 300 includes a Schmidt trigger 134. More particularly, the second terminal of the resistor 104 is electrically coupled to an input terminal of the Schmidt trigger 134. Additionally, an output terminal of the Schmidt trigger 134 is electrically coupled to the gate terminal of the transistor 114 and to the input terminal of the inverter 112. In addition, the second terminal of the resistor 126 is electrically coupled to the input terminal of the Schmidt trigger 134.

In one or more embodiments, the Schmidt trigger 134 is a comparator circuit in which positive feedback is applied to a non-inverting input terminal of a comparator or differential amplifier to provide hysteresis. For example, the input terminal of the Schmidt trigger 134 is the inverting input terminal of a comparator and the output terminal of the Schmidt trigger 134 is the output terminal of the comparator, wherein the output terminal of the comparator is electrically coupled to the non-inverting input terminal of the comparator.

The Schmidt trigger 134 uses two different threshold values to provide hysteresis to the amplifier circuit 300, including a first threshold value and a second threshold value, wherein the first threshold value is greater than the second threshold value. When a voltage at the input terminal of the Schmidt trigger 134 is greater than the first threshold value, a voltage at the output terminal of the Schmidt trigger 134 is relatively high. When the voltage at the input terminal of the Schmidt trigger 134 is below the second threshold value, the voltage at the output terminal of the Schmidt trigger 134 is relatively low. When the voltage at the input terminal of the Schmidt trigger 134 is between the first threshold value and the second threshold value, the voltage at the output terminal of the Schmidt trigger 134 stays at its present level.

Figure 4:
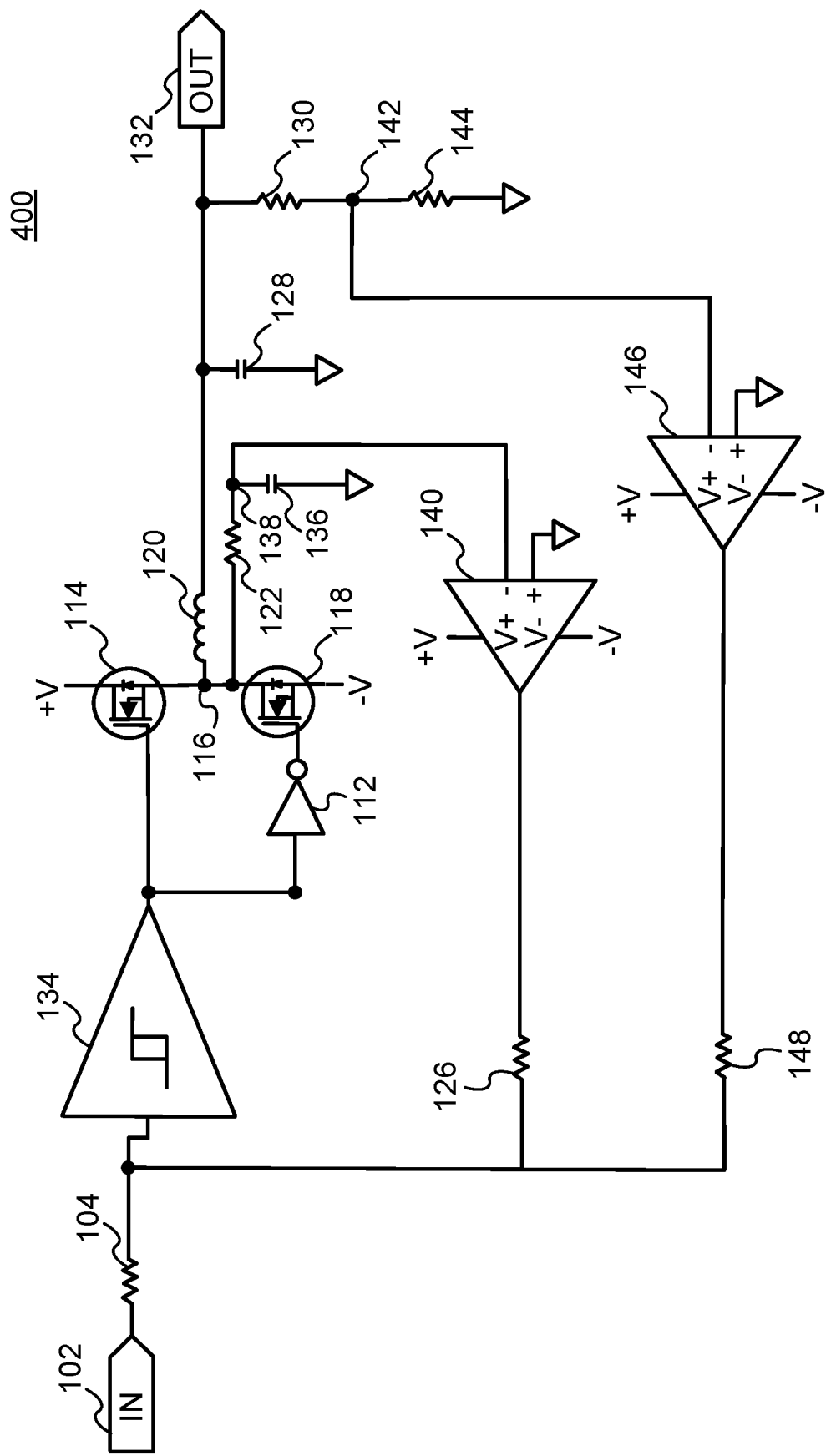
FIG. 4 is a diagram of yet another amplifier circuit, according to one or more embodiments of the present disclosure.

FIG. 4 is a diagram of yet another amplifier circuit 400, according to one or more embodiments of the present disclosure. The amplifier circuit 400 shown in FIG. 4 is similar in many relevant respects to the amplifier circuit 300 shown in FIG. 3. The same reference numbers are used in FIGS. 3 and 4 to identify similar components. Notably, the amplifier circuit 400 does not include the instrumentation amplifier 124, which is included in the amplifier circuit 100 and the amplifier circuit 300. Instead, the amplifier circuit 400 uses a modified output stage to provide self-oscillation feedback and shunt amplifier feedback signals to the Schmidt trigger 134, as described below.

More particularly, the second terminal of the inductor 120 is electrically coupled to the first terminal of the capacitor 128, to the first terminal of the resistor 130, and to the output terminal 132 of the amplifier circuit 400. Also, the first terminal of the resistor 122 is electrically coupled to the first terminal of the inductor 122 (instead of to the second terminal of the inductor 122, as with the previous embodiments), and the second terminal of the resistor 122 is electrically coupled to a first terminal of a capacitor 136, and a second terminal of the capacitor 136 is electrically coupled to a ground terminal.

Additionally, the second terminal of the resistor 122 and the first terminal of the capacitor 136 are electrically coupled to a node 138 that is electrically coupled to the inverting input terminal of an operational amplifier 140 that is configured to operate as a comparator. The non-inverting input terminal of the operational amplifier 140 is electrically coupled to a ground terminal. The output terminal of the operational amplifier 140 is electrically coupled to the first terminal of the resistor 126, which is electrically coupled to the input terminal of the Schmidt trigger 134, and provides a self-oscillation feedback signal to the Schmidt trigger 134. In other words, a first feedback circuit including the operational amplifier 140 electrically coupled in series with the resistor 126 provides the self-oscillation feedback signal to the Schmidt trigger 134.

In addition, the second terminal of the resistor 130 is electrically coupled to a node 142 (instead of to a ground terminal, as with the previous embodiments) that is electrically coupled to a first terminal of a resistor 144. A second terminal of the resistor 144 is electrically coupled to a ground terminal. Also, the node 142 is electrically coupled to the inverting input terminal of an operational amplifier 146 that is configured to operate as a comparator. The non-inverting input terminal of the operational amplifier 146 is electrically coupled to a ground terminal. The output terminal of the operational amplifier 146 is electrically coupled to a first terminal of a resistor 148. A second terminal of the resistor 148 is electrically coupled to the input terminal of the Schmidt trigger 134, and provides a shunt amplifier feedback signal to the Schmidt trigger 134. In other words, a second feedback including the operational amplifier 146 electrically coupled in series with the resistor 148 provides the shunt amplifier feedback signal to the Schmidt trigger 134.

Figure 5:
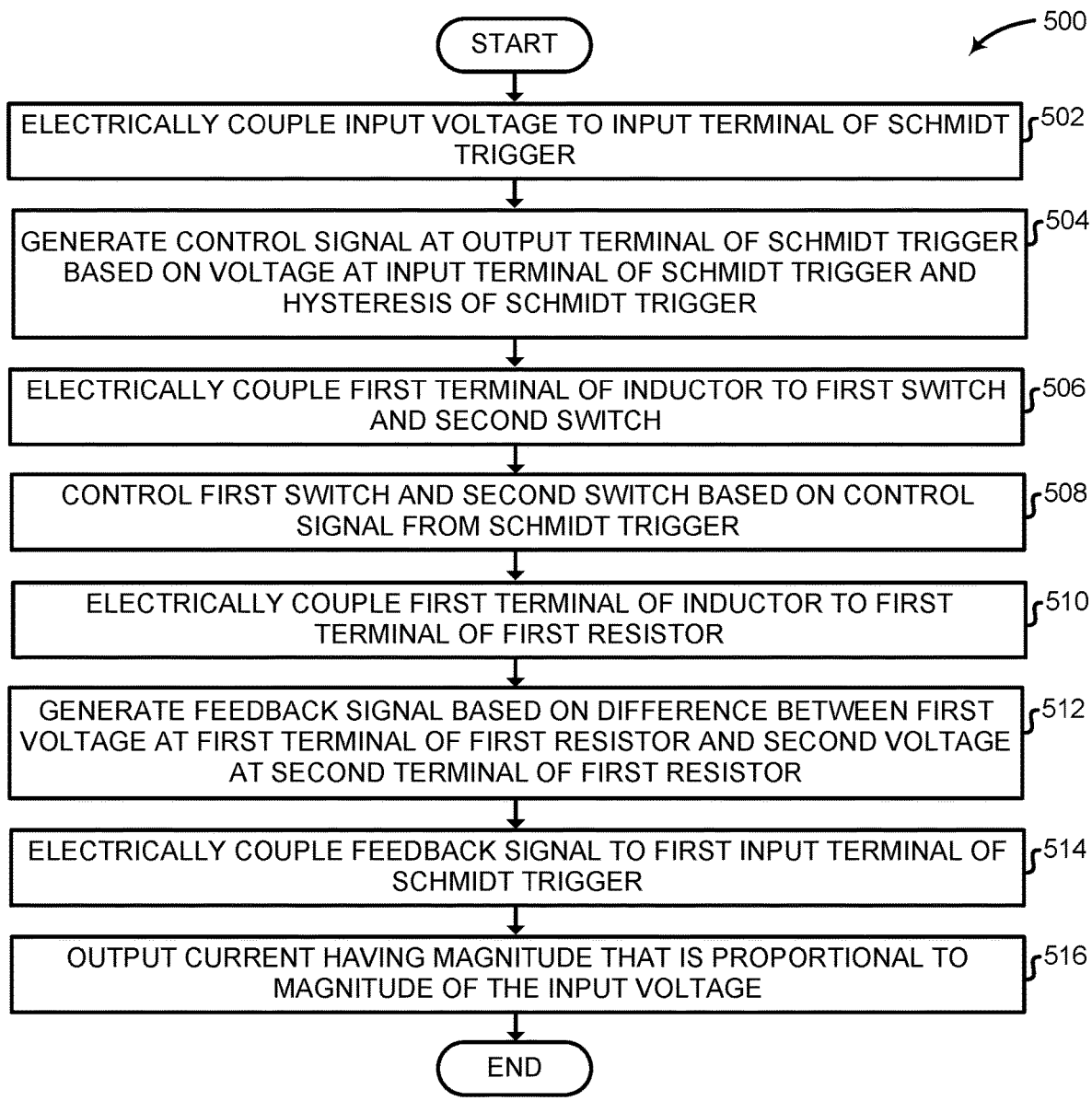
FIG. 5 is a flowchart of a method of outputting a current having a magnitude that is proportional to an input voltage magnitude, according to one or more embodiments of the present disclosure.

FIG. 5 is a flowchart of a method 500 of outputting a current having a magnitude that is proportional to an input voltage magnitude, according to one or more embodiments of the present disclosure. The method 500 is explained below with reference to FIGS. 3 and 5. The method 500 begins at 502.

At 502, an input voltage is electrically coupled to an input terminal of a Schmidt trigger. The method 500 then proceeds to 504.

For example, at 502, a first end of a first wire is soldered to an output terminal of a device that acts as a voltage source (not illustrated), and a second end of the first wire is soldered to the input terminal 102 of the amplifier circuit 300. Also, a first end of a second wire is soldered to the input terminal 102 of the amplifier circuit 300, and a second end of the second wire is soldered to a first terminal of the resistor 104. Additionally, a first end of a third wire is soldered to a second terminal of the resistor 104, and a second end of the third wire is soldered to the input terminal of the Schmidt trigger 134.

At 504, a control signal is generated at an output terminal the Schmidt trigger based on the input terminal of the Schmidt trigger and hysteresis of the Schmidt trigger. The method 500 then proceeds to 506.

For example, at 504, the Schmidt trigger 134 generates the control signal at the output terminal of the Schmidt trigger 134 using two hysteresis threshold values, as described above in connection with FIG. 3.

At 506, a first terminal of an inductor is electrically coupled to a first switch and a second switch. The method 500 then proceeds to 508.

For example, at 506, a first end of a fourth wire is soldered to a first terminal of the inductor 120, and a second end of the fourth wire is soldered to the source terminal of the transistor 114. Additionally, a first end of a fifth wire is soldered to the first terminal of the inductor 120 (or the source terminal of the transistor 114), and a second end of the fifth wire is soldered to the drain terminal of the transistor 118.

At 508, the first switch and the second switch are controlled based on the control signal from the Schmidt trigger. The method 500 then proceeds to 510.

For example, at 508, a first end of a sixth wire is soldered to the output terminal of the Schmidt trigger 134, and a second end of the sixth wire is soldered to the gate terminal of the transistor 114. Additionally, a first end of a seventh wire is soldered to the output terminal of the Schmidt trigger 134 (or the gate terminal of the transistor 114), and a second end of the seventh wire is soldered to the input terminal of the invertor 112. In addition, a first end of an eighth wire is soldered to the output terminal of the invertor 112, and a second end of the eighth wire is soldered to the gate terminal of the transistor 118. As the magnitude of the voltage of the control signal from the comparator 106 changes, the transistor 114 turns on and the transistor 118 turns off, or the transistor 114 turns off and the transistor 118 turns on, as described above.

At 510, a second terminal of the inductor is electrically coupled to a first terminal of a first resistor. The method 500 then proceeds to 512.

For example, at 510, a first end of a ninth wire is soldered to the second terminal of the inductor 120, and a second end of the ninth wire is soldered to the first terminal of the first resistor 122.

At 512, a feedback signal is generated based on a difference between a first voltage at the first terminal of the first resistor and a second voltage at a second terminal of the first resistor. The method 500 then proceeds to 514.

For example, at 512, a first end of a tenth wire is soldered to the first terminal of the resistor 122, and a second end of the tenth wire is soldered to the non-inverting input terminal of the instrumentation amplifier 124. Additionally, a first end of an eleventh wire is soldered to the second terminal of the resistor 122, and a second end of the eleventh wire is soldered to the inverting input terminal of the instrumentation amplifier 124. The instrumentation amplifier 124 compares a first voltage at the first terminal of the resistor 122 and a second voltage at the second terminal of the resistor 122. The resistor 122 operates to sense a current flowing through the inductor 120. The instrumentation amplifier 124 generates at its output terminal a feedback signal having a voltage this is equal to the gain of the instrumentation amplifier 124 times the difference between the first voltage at the first terminal of the resistor 122 and the second voltage at the second terminal of the resistor 122.

At 514, the feedback signal is electrically coupled to the first input terminal of the comparator. The method 500 then proceeds to 516.

For example, at 514, a first end of a twelfth wire is soldered to the output terminal of the instrumentation amplifier 124, and a second end of the twelfth wire is soldered to the first terminal of the resistor 126. Additionally, a first end of a thirteenth wire is soldered to the second terminal of the resistor 126, and a second end of the thirteenth wire is soldered to the input terminal of the Schmidt trigger 134.

At 516, a current having a magnitude that is proportional to a magnitude of the input voltage is output. The method 500 then ends.

For example, at 518, a current flowing through the inductor 120 is passed through the resistor 122 and is output from the output terminal 132 of the amplifier circuit 300.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An amplifier circuit comprising:
   a Schmidt trigger having an input electrically coupled to an input of the amplifier circuit;
   a switching network electrically coupled to an output of the Schmidt trigger;
   an inductor electrically coupled to the switching network, wherein based on a state of the switching network, the switching network provides a positive supply voltage or a negative supply voltage to the inductor, and wherein the inductor provides a circuit path to an output of the amplifier circuit;
   a first resistor electrically coupled to the inductor;
   a capacitor electrically coupled to the first resistor;
   a first feedback circuit that provides a first feedback signal to the input of the Schmidt trigger based on a voltage at a first node electrically coupled to the first resistor and to the capacitor;
   a second resistor electrically coupled to the output of the amplifier circuit;
   a third resistor electrically coupled to the second resistor; and
   a second feedback circuit that provides a second feedback signal to the input of the Schmidt trigger based on a voltage at a second node electrically coupled to the second resistor and to the third resistor,
   wherein the first feedback signal is different from the second feedback signal, and
   wherein a current at the output of the amplifier circuit is proportional to an input voltage applied to the input of the amplifier circuit.

2. The amplifier circuit according to claim 1, wherein the first feedback circuit includes a first operational amplifier electrically coupled in series with a fourth resistor, and the second feedback circuit includes a second operational amplifier electrically coupled in series with a fifth resistor.

3. The amplifier circuit according to claim 1, wherein the switching network includes:
   a first transistor having a gate that is electrically coupled to the output of the Schmidt trigger, and a source that is electrically coupled to the positive supply voltage; and
   a second transistor having a gate that is electrically coupled to the output of the Schmidt trigger via an inverter, and a drain that is electrically coupled to a negative supply voltage.

4. The amplifier circuit according to claim 3, wherein the inductor is electrically coupled to a drain of the first transistor and to a source of the second transistor, such that the inductor receives either the positive supply voltage via the first transistor or the negative supply voltage via the second transistor depending on alternating signals provided by the Schmidt trigger.

5. The amplifier circuit according to claim 1, wherein a first terminal of the first resistor is electrically coupled to the inductor, to a first switch, and to a second switch; a second terminal of the first resistor is electrically coupled to a first terminal of the capacitor and to the first node; and a second terminal of the capacitor is electrically coupled to ground.

6. The amplifier circuit according to claim 1, wherein the Schmidt trigger provides hysteresis to the amplifier circuit.

7. The amplifier circuit according to claim 1, further comprising filter circuitry coupled to the inductor that smooths fluctuations in a magnitude of the current at the output of the amplifier circuit.

8. A method comprising:
  electrically coupling an input voltage to an input terminal of a Schmidt trigger, wherein the Schmidt trigger includes a comparator configured to receive the input voltage at an inverting input and generate an output at an output terminal of the Schmidt trigger, and wherein the output is electrically coupled to a non-inverting input of the comparator;
  generating a control signal at the output terminal of the Schmidt trigger based on a voltage at the input terminal of the Schmidt trigger and hysteresis of the Schmidt trigger;
  electrically coupling a first terminal of an inductor to a first switch and a second switch;
  controlling the first switch and the second switch based on the control signal from the Schmidt trigger;
  electrically coupling a second terminal of the inductor to a first terminal of a first resistor;
  generating a feedback signal based on a difference between a first voltage at the first terminal of the first resistor and a second voltage at a second terminal of the first resistor;
  electrically coupling the feedback signal to the input terminal of the Schmidt trigger; and
  outputting a current having a magnitude that is proportional to a magnitude of the input voltage.

9. The method according to claim 8, further comprising: smoothing fluctuations in the magnitude of a current flowing through the inductor.

10. The method according to claim 8 wherein the first resistor operates to sense a current flowing through the inductor, and wherein generating the feedback signal includes electrically coupling the first terminal of the first resistor as first input to an instrumentation amplifier and electrically coupling the second terminal of the first resistor as second input to the instrumentation amplifier, the instrumentation amplifier operating as a differential amplifier that produces the feedback signal based on the difference in the voltage applied as the first and second inputs to the instrumentation amplifier.

* * * * *